United States Patent [19] [11] 4,084,968
Janssen et al. [45] Apr. 18, 1978

[54] METHOD OF MANUFACTURING ELECTRICALLY CONDUCTIVE METAL LAYERS ON SUBSTRATES

[75] Inventors: Casper Johannes Gerardus Ferdinand Janssen; Lambertus Postma; Gerardus Johannes Meinardus Lippits, all of Eindhoven, Netherlands

[73] Assignee: U.S. Philips Corporation, New York, N.Y.

[21] Appl. No.: 628,100

[22] Filed: Nov. 3, 1975

Related U.S. Application Data

[63] Continuation of Ser. No. 507,679, Sep. 20, 1974, abandoned, which is a continuation-in-part of Ser. No. 453,838, Mar. 22, 1974, abandoned.

[30] Foreign Application Priority Data

Mar. 30, 1973 Denmark ............................. 4429/73

[51] Int. Cl.$^2$ .......................... G03C 5/24; G03C 5/00
[52] U.S. Cl. .................................... 96/48 PD; 427/43; 427/304; 427/305; 427/306; 427/307; 427/336; 96/38.4
[58] Field of Search ............ 96/36, 36.2, 38.4, 48 PD; 427/43, 304, 305, 306, 307, 336

[56] References Cited

U.S. PATENT DOCUMENTS

| 3,674,485 | 7/1972  | Jonkers et al. ............... 96/48 PD |
| 3,687,668 | 8/1972  | Sullivan ........................ 96/48 PD |
| 3,698,840 | 10/1972 | Mersereau et al. ............ 117/212 |
| 3,719,490 | 3/1973  | Yudelson et al. ............. 96/48 PD |
| 3,808,028 | 4/1974  | Lando .......................... 427/307 X |
| 3,829,317 | 8/1974  | Case ............................ 96/48 PD |
| 3,830,649 | 8/1974  | Gracia et al. ................. 96/48 PD |

FOREIGN PATENT DOCUMENTS 1,229,935   4/1971   United Kingdom.

Primary Examiner—Edward C. Kimlin
Attorney, Agent, or Firm—Frank R. Trifari; Norman N. Spain

[57] ABSTRACT

Method of metallizing, according to a pattern or uniformly, substrates which consist of a resin which contains either throughout its bulk or in a surface layer, a photosensitive semiconductive oxide, which after exposure to light is capable of depositing metal nuclei from a solution of copper ions or ions of a nobler metal, which nuclei are intensified in mass, while by way of pre-treatment the substrate is treated with a dipolar aprotic swelling agent and then with a chemical roughening agent.

4 Claims, No Drawings

METHOD OF MANUFACTURING ELECTRICALLY CONDUCTIVE METAL LAYERS ON SUBSTRATES

This is a continuation of application Ser. No. 507,679 filed Sept. 20, 1974 now abandoned, which is a continuation-in-part of Application Ser. No. 453,838, filed Mar. 22, 1974, now abandoned.

The invention relates to a method of photochemically metal plating a synthetic material either uniformly or according to a pattern, and in particular to an additive method of photographically manufacturing electrically conductive metal patterns on an insulating substrate consisting of a synthetic resin, specifically printed circuits and the products obtained by the use thereof.

The term "additive method of manufacturing printed circuits" is used herein to denote a method of the type in which the metal pattern is directly built up on the non-coated layer of the synthetic resin. A method of this type is distinguished from a subtractive method which starts with a layer consisting of a synthetic resin which is coated with a layer of metal the superflous part of which is removed by etching after the metal parts which comprise the pattern have been coated with a resist.

British patent specification No. 1,229,935 describes a complete additive method of photochemically metallizing synthetic resins. In this method a photosensitive insulating layer is used which either is self-supporting or is coated on a possibly insulating substrate and comprises an insulating predominantly hydrophobic resinous binder in which solid finely dispersed particles of a photosensitive semiconducting oxide are homogeneously distributed, the light-reaction product of said oxide being capable of depositing copper and/or a metal nobler than copper from a solution of the respective metal salt, while before and/or after exposure to light the layer is brought into contact with such a solution, so that metal nuclei are produced which by means of a stabilized physical developer or an electroless metallizing solution are intensified to form a conductive pattern which, if desired, may be intensified by electrodeposition.

In order to obtain good mechanical strength of the photosensitive insulating layer it obviously is necessary for each individual particle of the semiconductive metal oxide to be entirely enveloped by the hydrophobic binder, and this is also desirable to impart the required electric properties to the photosensitive insulating layer. However, this means that at the surface of the photosensitive insulating layer the metal oxide particles are substantially entirely screened from the solution of the metal salt which by reacting with the light-activated particles is to yield the nucleus metal, and also from the intensifying solutions. This means that the formation of metal nuclei and the intensification of the image of metal nuclei on the photosensitive insulating layer are greatly inhibited.

In the cases where the photosensitive insulating layer is coated on a possibly insulating base layer, the screening of the semiconductive metal oxide particles available at the surface may be eliminated in a manner described in British patent specification 1,338,435. According to this Specification a partially hardened layer of a binder which consists of thermosetting constituents in which rubber-like constituents are evenly distributed and in which the photosensitive semiconductive metal oxide is dispersed, is subjected to controlled superficial attack by a chemical roughening liquid so that a thickness between about 0.1 μm and 1 μm is etched from the layer.

When the photosensitive insulating layer is self-supporting, the said method has the disadvantage that binder layers are used which are hardened partly only, so that the layers have too small mechanical rigidity and too low strength. It is true that thermal hardening performed after the provision of the conducting patterns improves the mechanical properties, however, it also brings about unacceptable changes in the relative positions of the patterns.

Finally United States Patent Specification No. 3,698,940 describes a method of treating a moulded polymerized resin substrate to improve adhesion between the substrate and a metal deposit electrolessly plated thereon. This improved adhesion is achieved by contacting the surface of the substrate with a representative of a given group of dipolar aprotic organic solvents and subsequently with an aqueous chromic acid solution. After catalyzing the surface by means of an aqueous solution of a nobel metal salt the catalyzed substrate is heated to a temperature above ambient temperature but considerably below the charring temperature.

The main disadvantage of this method is that it is much more laborious than the method which starts with a photosensitive insulating layer. Another important disadvantage is that good adhesion is obtained only with substrates of slightly heterogeneous composition, because the combined surface treatment is required to produce anchoring areas for the metal to be deposited.

A method of photochemically metallizing flexible or rigid moulded polymerized resin substrates either uniformly or according to a pattern, which substrates contain either in a surface layer or throughout their bulk, homogeneously finely dispersed particles of a photosensitive semiconducting metal oxide the light-reaction product of which is capable of depositing copper and/or a metal nobler than copper from a solution of the respective metal salt, in which method before and/or after exposure to light the layer is contacted with such a solution so as to form metal nuclei which are intensified to form an electrically conductive layer by means of a physical developer or an electroless plating solution and if desired are intensified by electrodeposition according to the invention is characterized in that the substrate is pretreated by successively contacting it with a dipolar aprotic solvent capable of slightly swelling the substrate and with a chemical roughening solution.

The method according to the invention which in actual fact is a combination of the method described in British patent specification No. 1,229,935 and that described in United States patent specification No. 3,698,940 has the advantage that compared with the latter method a considerably less laborious method of manufacturing printed circuits is obtained.

Another important advantage, however, is that with respect to the choice of the substrate material in which the finely divided semiconductive metal oxide is dispersed there now are many possibilities apart from epoxy-base or phenol-base resins reinforced with glass cloth to which the known method is restricted in practice, for the introduction of the photosensitive semiconductive metal oxide into the insulating self-supporting layer proves to provide the advantage that it makes the composition of the material heterogeneous so that during the treatment with the chemical roughening liquid excellent anchorages for the metal to be deposited are simply obtained. Thus the slightly heterogeneous composition of the binder combination as required in the known method can be dispensed with owing to the presence of the photosensitive semiconductive oxide. Consequently, printed circuits made by means of the said substrate layers show very good adhesion.

In the method according to the invention for manufacturing printed circuits the operations of plating through-holes can simply be fitted in. Starting with a base material in which the photosensitive semiconductive metal oxide is thoroughly dispersed the walls of the holes may be sensitized by exposure to light of the metal oxide uncovered by the hole-drilling operation and by subsequent contacting with a solution of a copper salt or a salt of a metal nobler than copper. The resulting layer consisting of nuclei can then be intensified by means of a stabilized physical developer or an electroless metal plating bath.

The method may alternatively start with a material which contains the photosensitive semiconductive metal oxide in the upper layers of both major surfaces, said surface layers furthermore containing a substance which is dispersed in the substrate material and is capable or producing sensitisation without exposure to light. In the afore mentioned British patent specification 1,338,435 such substances are mentioned, such as reducing agents for noble metal ions, redox polymers and ion exchangers charged with reducing ions.

In a preferred embodiment the material contains an uncharged anion exchanger within the surface layers which contain the semiconductive oxide, whilst after the holes have been drilled activation is effected by means of Pd halides and preferably by means of Pd chloride. This is due to the fact that the activation solution contains mainly $PdCl_4 =$ ions.

Suitable base materials in which the semiconductive metal oxide is dispersed are, in addition to epoxy resin reinforced with glass fibers, hard paper, polysulphone foil, and so on. Suitable swelling agents are for example N-methyl pyrrolidone, dimethyl formamide, dimethyl acetamide, tetrachloroethane, tetrahydrofurane, acetonitrile, hexamethylphosphortriamide, and dimethyl sulfoxide. Each material has its specific preferred swelling agents. For example, hard paper can successfully be treated with N-methyl pyrrolidone and dimethyl formamide, epoxy material with dimethyl formamide or N-methyl pyrrolidone, polyimide with dimethylacetamide and polysulphone with tetrachloroethane.

The swelling agent should be applied to the substrate for a time sufficient to cause a slight swelling of the substrate.

Examples of roughening agents that may be used are a mixture of sulfuric acid, phosphoric acid and water, a solution in sulfuric acid of chromium trioxide, a saturated chromic acid solution, a solution of fluoboric acid containing sodium dichromate, a solution of potassium permangamate in sulfuric acid, and a solution of nitric acid.

The roughening agent should be applied for a time so that the swollen layer is oxidized to about half of its depth having a rough surface for good adhesion for the metal layer to be applied.

In order that the invention may be readily carried into effect, it will now be described in detail, by way of illustration, with reference to the following Examples:

EXAMPLE 1

Sheets of paper are dipped in a bath consisting of a dispersion of $TiO_2$ in a phenol formaldehyde resin. The dispersion contains 35 g of $TiO_2$ to 32 g of phenol and 36 g of formalin. The sheets are pressed with a pressure of 60 kg/cm$^2$ at a temperature of 150° C. A $TiO_2$-filled phenol hard paper is obtained.

The base material is treated with N-methyl pyrrolidone for 3 minutes and then rinsed in methyl ethyl ketone/methanol (1 : 1).

The surface is roughened by treating the material for from 8 to 16 minutes in a mixture of
- 100 ml of $H_2SO_4$
- 100 ml of $H_2O$
- 50 ml of $H_3PO_4$
- 30 g of sodium bichromate at a temperature of 50° C.

The material is then rinsed in flowing water and neutralized in a 0.1 N solution of NaOH. Any $TiO_2$ particles which may be loosely attached are removed by ultrasonic vibration in water.

The material is then treated with a solution containing per liter
- 1 g of $PdCl_2$
- 5 ml of Hcl (37 %)
- 4 g of Lissapol N
- 10 g of glycerine (Lissapol N is a non-ionogenic wetting agent consisting of a condensation product of ethelene oxide with alkyl phenol).

Subsequently the materia is dried and exposed behind a negative by means of a 125 W high-pressure mercury-vapor lamp at a distance of 30 cm for 30 seconds. A latent image consisting of Pd-nuclei is produced at the exposed areas.

At the non-exposed areas the $Pd^{++}$ ions are removed by rinsing with water.

The latent is intensified for 2 minutes in a chemical copper-plating bath having a temperature of 25° C and containing per liter:
- 0.14 mol of $CuSO_4.5H_2O$
- 0.30 mol of tetrasodium salt of ethylene diamine tetraacetic acid
- 0.65 mol of NaOH
- 2.0 mol of formaldehyde The conductive pattern is then intensified to an overall thickness of 25 μm by electrodeposition of copper. After a temperature treatment at 170° C for 30 minutes the adhesion is 65 g/mm.

EXAMPLE 2

$TiO_2$ is dispersed in an epoxy resin, in an amount of 50 g of $TiO_2$ per 100 g of resin by grinding the mixture in a ball mill for 24 hours. Glass cloth is impregnated with the pigmented resin and pressed at a temperature of 170° C and a pressure of 35 kg/cm$^2$.

The base material is treated with dimethyl formamide for 3 minutes and rinsed in methyl ethyl ketone. It is then chemically roughened, nucleated, chemically copper-plated and finally copper-plated by electrode-position, similarly as described in Example 1. After a temperature treatment at 170° C for 30 minutes the adhesion is 160 g/mm.

EXAMPLE 3

A homogeneous dispersion of $TiO_2$ is obtained by grinding finely dispersed particles of $TiO_2$ together with a polyamide acid (Pyre ML from Du Pont) and N-methyl pyrrolidone in an amount of 34 g of TiO₂ (A10 of Tiofine)
200 g of polyamide acid
30 g of N-methylpyrrolidone.

This dispersion is applied to a substrate consisting of polyimide. (Kapton from Du Pont). The adhesive layer is dried at 350° C for 1 hour. The photosensitive adhesive layer then is from 12 to 15 μm thick.

The material is treated with dimethyl acetamide for 1 minute and rinsed with a methyl ethyl ketone/methanol (1 : 1) solution for 2 minutes. Then the surface is roughened by a treatment in a mixture consisting of:

1 % by weight of CrO₃
84% by weight of H₂SO₄
15% by weight of H₂O at a temperature of 50° C for 1 min. Subsequently the surface is nucleated, chemically copper-plated and copper-plate by electrodeposition, similarly to Example 1. After a temperature treatment at 230° C for 30 minutes the adhesion of the copper pattern is 120 g/mm. Polyamide acids have the following structure:

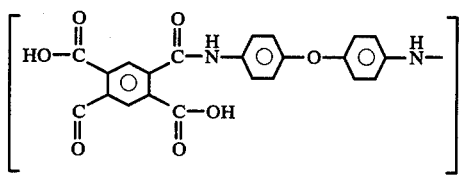

see for example United States patent specifications Nos. 3,179,614; 3,179,631; 3,179,633 and 3,179,634.

EXAMPLE 4

Base material consisting of a polyamide film (Kapton from Du Pont) is coated with a layer having a thickness of 15 μm and consisting of polysulphone (from Union Carbide) and TiO₂ in a ratio by weight of:

10 g of TiO₂ (Degussa P 25)
60 g of polysulphone (15 % solution).
100 g of trichloroethane.

This is obtained by applying a dispersion of TiO₂ in polysulphone and heating it dispersion a temperature of 200° C for 30 minutes. The surface is then treated with tetrachloroethane for 3 minutes and rinsed with methyl ethyl ketone/methanol (1 : 1). The material is then roughened in a saturated chromic acid solution for 4 minutes. The further treatment is similar to that described in Example 1. After a temperature treatment at 230° C for 30 minutes the adhesion is 60 g/mm.

Polysulphones have approximately the following structure:

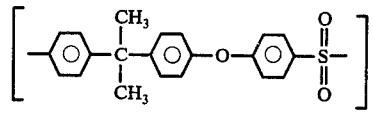

What is claimed is:

1. In a method of photochemically metal-plating desired portions of a synthetic resin substrate containing, at least in a surface layer, homogeneously finely dispersed particles of a photo-sensitive semiconductive metal oxide, the light reaction product of which is capable of depositing metals at least as high as copper in the E.M.F. series of metals from a solution of the respective metal salt, by exposing desired portions of said substrate to light and contacting said substrate with said solution of the metal salt thereby causing a metal nuclei image to be formed at the exposed areas of the substrate and then intensifying said metal nuclei image by treatment of the substrate with an electroless plating bath, the improvement wherein as a pretreatment the metal oxide containing substrate before exposure is first contacted with a dipolar aprotic solvent capable of slightly swelling said substrate for a time such that a slight swelling of the substrate is caused and a swollen layer is formed and then with a chemical roughening agent comprising a solution of an inorganic oxidizing acid for a time sufficient to oxidize about half the depth of the swollen layer.

2. In a method of photochemically metal-plating desired portions of a synthetic resin substrate containing, at least in a surface layer, homogeneously finely dispersed particles of a photo-sensitive semiconductive metal oxide, the light reaction product of which is capable of depositing metals at least as high as copper in the E.M.F. series of metals from a solution of the respective metal salt, by exposing desired portions of said substrate to light and contacting said substrate with said solution of the metal salt thereby causing a metal nuclei image to be formed at the exposed areas of the substrate and then intensifying said metal nuclei image by physical development of the substrate with a stabilized physically developing solution the improvement wherein as a pretreatment the metal oxide containing substrate before exposure is first contacted with a dipolar aprotic solvent capable of slightly swelling said substrate for a time such that a slight swelling of the substrate is caused and a swollen layer is formed and then with a chemical roughening agent comprising a solution of an inorganic oxidizing acid for a time sufficient to oxidize about half the depth of the swollen layer.

3. The method of claim 1 wherein the chemical roughening agent is selected from the group consisting of a mixture of sulfuric acid, phosphoric acid and water, a solution of chromic trioxide in sulfuric acid, a saturated chromic acid solution, a solution of sodium dichromate in fluoboric acid, a solution of potassium permanganate in sulfuric acid and a solution of nitric acid.

4. The method of claim 2 wherein the chemical roughening agent is selected from the group consisting of a mixture of sulfuric acid, phosphoric acid and water, a solution of chromic trioxide in sulfuric acid, a saturated chromic acid solution, a solution of sodium dichromate in fluoboric acid, a solution of potassium permanganate in sulfuric acid and a solution of nitric acid.

* * * * *

UNITED STATES PATENT AND TRADEMARK OFFICE
CERTIFICATE OF CORRECTION

PATENT NO. : 4,084,968
DATED : April 18, 1978
INVENTOR(S) : CASPER JOHANNES GERARDUS FERDINAND JANSSEN ET AL It is certified that error appears in the above-identified patent and that said Letters Patent are hereby corrected as shown below:

In the Title Page, Item [30]:

"March 30, 1973 Denmark.......4429/73" should read -- March 30, 1973 Netherlands...7304429 --.

Signed and Sealed this

Thirty-first Day of October 1978

[SEAL]

Attest:

RUTH C. MASON
Attesting Officer

DONALD W. BANNER
Commissioner of Patents and Trademarks